United States Patent [19]

Malhi et al.

[11] Patent Number: 4,875,086
[45] Date of Patent: Oct. 17, 1989

[54] SILICON-ON-INSULATOR INTEGRATED CIRCUITS AND METHOD

[75] Inventors: Satwinder D. S. Malhi, Garland; Chi-Cheong Shen; Kenneth E. Bean, both of Richardson; Peng-Heng Chang, Dallas, all of Tex.

[73] Assignee: Texas Instruments Incorporated, Dallas, Tex.

[21] Appl. No.: 53,440
[22] Filed: May 22, 1987
[51] Int. Cl.⁴ .............. H01L 23/08; H01L 23/14; H01L 23/10; H01L 25/08
[52] U.S. Cl. .................... 357/54; 357/53; 357/59
[58] Field of Search .......... 357/59, 54, 73, 59

[56] References Cited
U.S. PATENT DOCUMENTS 4,017,341  4/1977  Suzuki et al. ................ 357/59
4,344,985  8/1982  Goodman et al. ............. 357/54

FOREIGN PATENT DOCUMENTS 0021553  2/1985  Japan ......................... 357/59

Primary Examiner—Rolf Hille
Assistant Examiner—S. V. Clark
Attorney, Agent, or Firm—Carlton H. Hoel; James T. Comfort; Melvin Sharp

[57] ABSTRACT

Preferred embodiments include silicon-on-insulator structures (30) and integrated circuits include a thin single crystal silicon layer (32) on a silicon dioxide layer (34) which is on a polysilicon layer (36) bonded to a surface-oxidized silicon substrate (42) by a glass layer (38). Also, single crystal silicon layers on oxide on polysilicon substrates and methods of fabrication are included in the preferred embodiments.

13 Claims, 3 Drawing Sheets

SILICON-ON-INSULATOR INTEGRATED CIRCUITS AND METHOD

BACKGROUND OF THE INVENTION

1. Field of the Invention.

The present invention relates to semiconductor electronic materials and devices, and, more particularly, to silicon-on-insulator materials and devices and methods of fabrication.

2. Description of the Related Art.

Recently there has been intensive effort to produce electronic quality silicon-on-insulator for very large scale integration applications. See K. Hashimoto et al, Characteristics of Submicrometer CMOS Transistors in Implanted-Buried-Oxide SOI Films, 1985 IEDM Tech. Dig. 672, which notes that silicon-on-insulator technology offers significant potential advantages, such as freedom from latchup in CMOS structures, high packing denisty, low parasitic capacitances, low power, radiation hardness, high voltage operation, and the possibility of three-dimensional integration. Additionally, silicon-on-insulator technology using very thin films offers special advantages for submicron devices. Scaling bulk devices tends to degrade their characteristics because of small-geometry effects, such as punch-through, threshold-voltage shift, and subthreshold-slope degradation; the use of silicon-on-insulator devices suppresses these small-geometry effects. Therefore, even in the submicron VLSI era, silicon-on-insulator technology can offer even higher device performance than can bulk technology, along with the inherent advantages of silicon-on-insulator.

Silicon-on-insulator substrates may be fabricated in various ways: a crystalline silicon layer may be formed over an existing oxide layer either by laser or strip heater recrystallization of polysilicon deposited on the oxide or by selective epitaxial silicon growth over the oxide. However, the quality of such a silicon layer is generally inferior to that normally associated with bulk silicon. Other approaches form an oxide layer beneath an existing high quality silicon layer either by oxidizing a buried porous silicon layer or by oxygen ion implantation; however, such oxide is low quality and the silicon top layer may be damaged during the oxide layer formation.

Another approach to silicon-on-insulator is wafer bonding as described by J. Lasky et al, Silicon-On-Insulator (SOI) by Bonding and Etch-Back, 1985 IEDM Tech. Deg. 684. This wafer bonding process proceeds as follows: a lightly doped epitaxial layer of silicon is grown on a heavily doped silicon substrate, oxide is thermally grown on the epilayer, a second lightly doped silicon substrate is thermally oxidized, the two oxidized surfaces are pressed together and inserted into an oxidizing atmosphere at 1,100° C. to bond them, and a preferential etch is used to remove the heavily doped substrate, leaving the thin, lightly doped epitaxially layer above the bonded thermally grown oxides which are now on the second substrate. The resulting thin silicon layer above the thermally grown oxide has high quality and the oxide also retains its quality and may be thick, as might be desired for CMOS or high voltage devices, or thin, as might be desired for shared element applications. Conceptually, this process may meet all the desired goals for the ultimate silicon-on-insulator material (a specular finished crystalline silicon layer without dislocations and a back interface with the insulator of quality equal to the interface of thermally grown silicon dioxide on silicon; both the crystalline silicon layer and the insulator of variable thickness). However, in practice this process suffers from a serious drawback: a particle between the two mechanically rigid substrate surfaces keeps a substantial area around the particle from bonding. The acute susceptibility of this bonding process to particulate disruption makes the process unattractive for production. Also, the high temperature bonding leads to diffusion of the dopants which degrades the etchstop at the epitaxial layer.

An alternative wafer bonding approach to silicon-on-insulator appears in M. Kimura et al, Epitaxial Film Transfer Technique for Producing Single Crystal Si Film on an Insulating Substrate, 43 Appl. Phys. Lett. 263 (1983). This latter process applies a layer of $PbO-B_2O_3-SiO_2$ glass on each of two oxidized silicon wafers (one wafer being a heavily doped substrate with a lightly doped epilayer) and presses the two glassy surfaces together at 930° C. to bond the wafers; the heavily doped substrate is etched away leaving the epilayer as silicon-on-insulator. Because the wafers must be pressed together at high temperature, this latter process is not suitable for volume production. And the process has the same sensitivity to particulate disruption as previously described.

A similar etchback after forming a secondary substrate method appears in G. Kuhn et al, Thin Silicon Film on Insulating Substrate, 120 J. Electrochem. Soc. 1563 (1973), which forms a thick polysilicon secondary substrate on a silicon substrate with a surface-oxidized lightly doped epilayer on a heavily doped layer; the silicon substrate is then etched away with the heavily doped layer selectively etched to leave the lightly doped epilayer as silicon-on-insulator with the polysilicon secondary substrate as support. However, the polysilicon deposition leads to warping of the silicon substrate and a warped final structure. Also, the polysilicon deposition is performed at high temperature ($\approx 1{,}200°$ C.) wich diffuses the doped etchstop drastically, thereby preventing the fabrication of thin silicon-on-insulator layers with good control.

The above-mentioned wafer bonding approaches have problems limiting their use in volume production processes for thin silicon-on-insulator layers of high quality.

SUMMARY OF THE INVENTION

The present invention provides silicon-on-insulator structures with a single crystal silicon layer on silicon dioxide which in turn is bonded to a silicon substrate by layers of polysilicon and glass. The invention also provides methods of fabrication for these structures: by bonding two oxidized wafers with a glass bond plus a polysilicon buffer layer followed by an etchback of one of the wafers to expose previously-bulk silicon or epitaxial silicon on one of the original oxidized layers. The glass is thick enough to overcome the formation of voids due to small paticulate contamination on the wafer surfaces prior to bonding. The polysilicon buffer layer provides a barrier to the glass reacting with and degrading the insulating oxide and provides physical stability as well as thermal match to the thin silicon layer.

The preferred embodiment methods of fabrication of silicon-on-insulator structures include a relatively low temperature bonding step to avoid diffusion of etchstop dopants and yield a flat, specular silicon-on-insulator surface; and a suspension of the glass in a photoresist-like material to avoid the necessity of applied pressure during the fusing of the glass.

This solves the problems of etchstop dopant diffusion and pressurized wafer bonding in the known wafer bonding approaches.

BRIEF DESCRIPTION OF THE DRAWINGS

The drawings are schematic for clarity.

DESCRIPTION OF THE PREFERRED EMBODIMENTS

Figure 1:
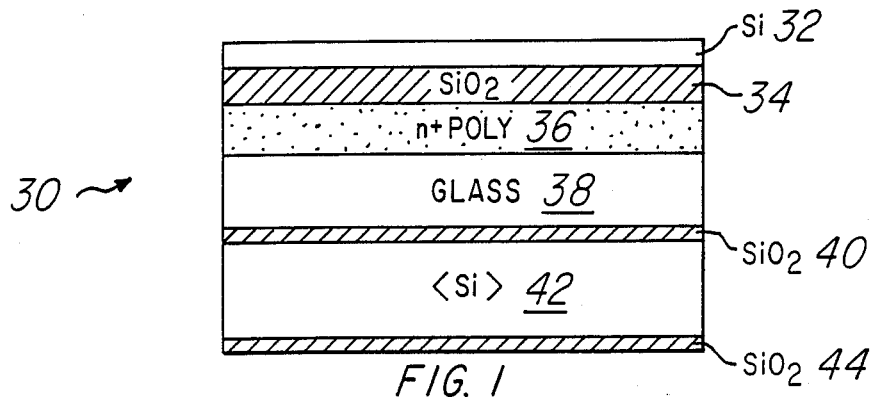
FIG. 1 is a cross sectional elevation view of a first preferred embodiment silicon-on-insulator structure.

FIG. 1 is a cross sectional elevation view of a first preferred embodiment silicon-on-insulator structure, generally denoted by reference numeral 30, which includes (100) oriented $p^-$ silicon epilayer 32, silicon dioxide layer 34, polycrystalline silicon (polysilicon) layer 36, glass layer 38, silicon dioxide layer 40, single crystal silicon substrate 42, and silicon dioxide layer 44. Epilayer 32 is 0.5 $\mu$m thick and doped to a carrier concentration of $1 \times 10^{14}/cm^3$ with boron; oxide 34 is 1.0 $\mu$m thick; polysilicon 36 is doped $n^+$ and 15.0 $\mu$m thick; glass 38 is 12.0 $\mu$m thick; oxides 40 and 44 are 1.2 $\mu$m thick; and silicon substrate 42 is doped $n^-$, oriented (100) and 0.5 mm thick. Silicon epilayer 32 is the silicon on the insulator, and the insulator is oxide 34. Note that polysilicon 36 could have been doped $p^+$ or undoped or lightly doped, and that similarly silicon substrate 42 could have been doped $p^-$.

Characteristics of structure 30 may be best described in connection with a first preferred embodiment method of fabrication, illustrated in FIGS. 2A–D, which includes the following steps:

(a) Thermally grow oxides 40 and 44 on $n^-$ doped, (100) oriented, four-inch diameter first silicon substrate 42. Epitaxially grow $p^{++}$ etchstop layer 52 by hydrogen reduction of dichlorosilane with diborane for in situ doping plus germane for strain compensation at 1050° C. to a thickness of 2.0 $\mu$m on high resistivity (100) oriented, four-inch diameter, second silicon substrate 50. The doping of etchstop layer 52 is to a resistivity of 0.0006–0.0008 $\Omega$-cm (about $1.5 \times 10^{20}/cm^3$ boron concentration and the compensating germanium concentration is about an order of magnitude higher. Note that in FIG. 2A substrate 50 is shown with $p^{++}$ etchstop layer 52 on its lower surface, this anticipates the alignment with substrate 42 for bonding.

(b) Grow 1.0 $\mu$m thick epitaxial silicon layer 32 on $p^{++}$ layer 52 by CVD (dichlorosilane at 975° C. for 10 minutes). Layer 32 is in situ boron doped to a carrier concentration of $1 \times 10^{14}/cm^3$. The use of dichlorosilane and the short growth time limit diffusion of dopants out of $p^{++}$ layer 52.

(c) Deposit 1.0 $\mu$m thick layer 34 of oxide on epilayer 32 by decomposition of tetraethoxysilane ($Si(OC_2H_5)_4$ and abbreviated as TEOS) at 700° C. Again, the low temperature of the deposition limits diffusion of the dopants from $p^{++}$ layer 52.

Figure 2A:
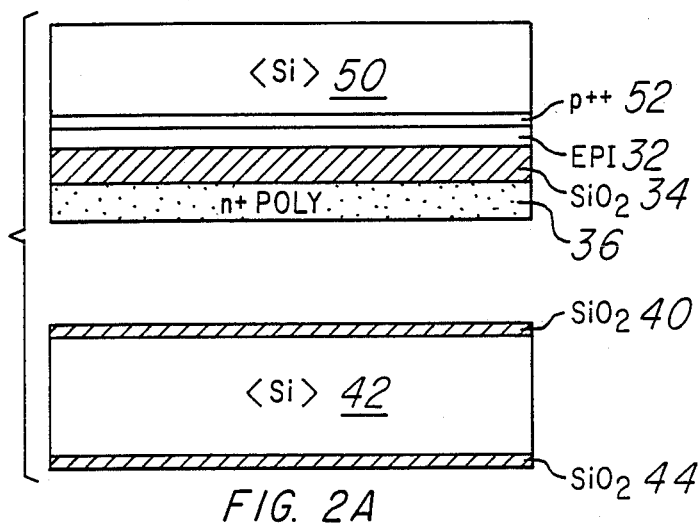
FIGS. 2A–D illustrate a first preferred embodiment method of fabrication of the first preferred embodiment structure.
Figure 2B:
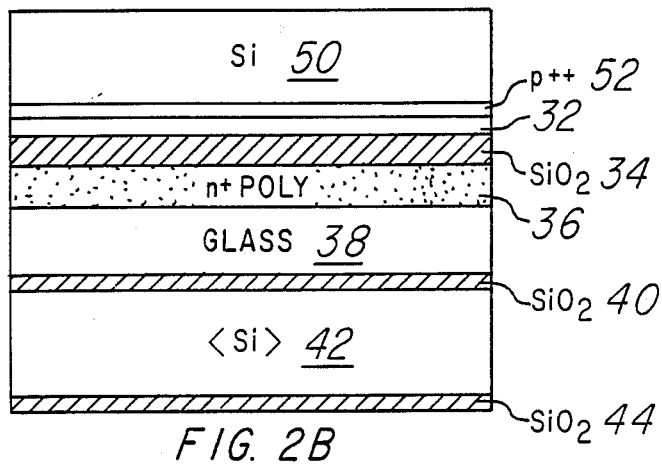

(d) Deposit 15.0 $\mu$m thick layer 36 of $n^+$ polysilicon on oxide layer 34 by CVD with dichlorosilane plus phosphine at 950° C.; see FIG. 2A. Polysilicon layer 36 acts as a barrier to prevent the glass of the next step from reacting and degrading oxide 34 during firing of the glass. Again, the deposition is fairly quick (a few minutes) and a low enough temperature to limit diffusion of dopants from $p^{++}$ layer 52. Note that alternative barriers tested such as silicon nitride are not as effective as polysilicon.

(e) Spin coat (at 5,000 rpm) each substrate (on the surface of polysilicon layer 36 and on the surface of oxide layer 40) with a 6 $\mu$m thick layer of resist glass of the following composition: 235 grams of negative photoresist and 270 grams of a powder of 50% PbO, 40% $SiO_2$, and 10% $Al_2O_3$ with an average particle size of 2 $\mu$m. The photoresist is a 1:1 mixture of Hunt Waycoat SC180 and Hunt Waycoat SC450 which are commercial negative photoresists and basically composed of polyisoprene rubber in a xylene solvent. Note that the SC180 and SC450 are similar and differ in viscosity due to different concentrations in the solvent; the mixture is used to obtain an intermediate viscosity. While the resist glass is still wet align the two substrates and press them together (at about 10 psi) with the two resist glass layers joining to form one resist glass layer of 12 $\mu$m thickness; the pressure is only to squeeze out air bubbles and need be applied for only one minute after which the substrates will adhere due to the viscous nature of the wet resist glass. The wet resist glass layer is thick enough to surround contamination particles of diameter up to about 10 $\mu$m and prevent such particles from disrupting the bonding. Release the pressure and air dry the adhered substrates at 100° C. for twenty-four hours to remove the bulk of the solvent, then burn off the residual solvent and carbonize the polyisoprene at 600° C. for 30 minutes in $O_2$, and lastly fire the glass at 900° C. for 30 minutes in $O_2$ to form glass layer 38 which fuses the substrates together; see FIG. 2B. The 900° C. fusing is at a low enough temperature to limit diffusion of dopants out of $p^{++}$ layer 52. Glass layer 38 is about 12.0 $\mu$m thick.

Figure 2C:
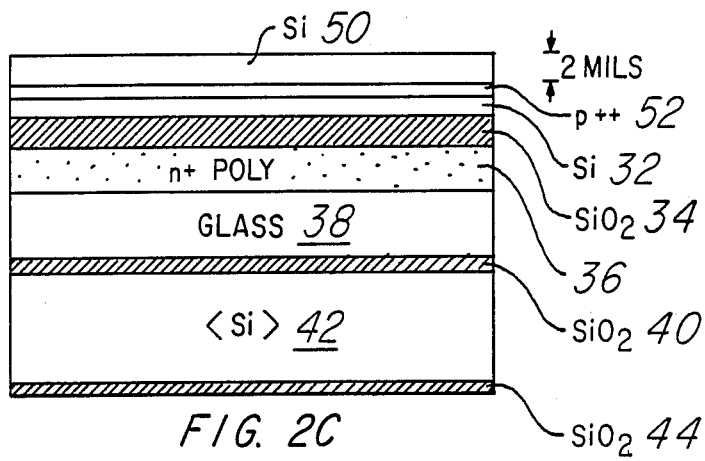
Figure 2D:
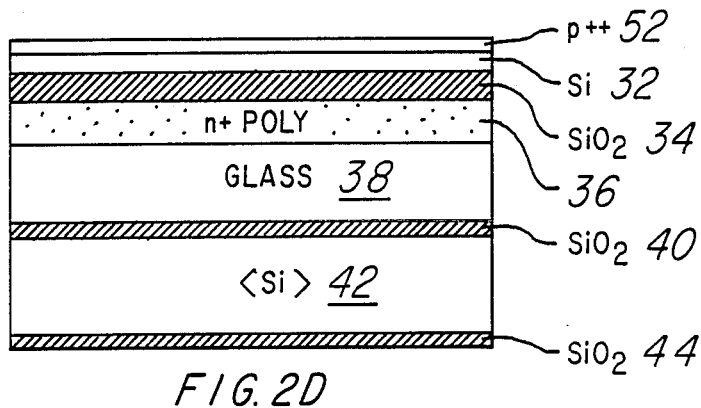

(f) Polish substrate 50 down to a thickness of about 50 $\mu$m (2 mils); see FIG. 2C. Note that the uniformity of the polishing is not crucial because selective etching down to $p^{++}$ layer 52 follows.

(g) Etch the remainder of substrate 50 with an aqueous solution of KOH and propanol (isopropyl alcohol) composed of 465 gm KOH, 1500 ml water, and 465 ml propanol. This solution etches high resistivity silicon 50 at more than 500 times the rate it etches $p^{++}$ silicon 52, and the etch is easily stopped at $p^{++}$ layer 52; see FIG. 2D.

(h) Etch away $p^{++}$ layer 52 with a solution of HF, $HNO_3$, and HAc (acetic acid) in the ratio of 1:3:8; this etch is greater than 100:1 selective over $p^-$ silicon layer 32. The resulting silicon-on-insulator structure with $p^-$ silicon layer 32 on oxide layer 34 is as shown in FIG. 1. Layer 32 was originally formed by epitaxial growth on $p^{++}$ layer 52, and layer 32 retains its crystalline quality and flat surface due to the low temperature processing. After the 1:3:8 etch a tail of $p^{++}$ autodoped region remains which must be removed to assure high resistivity in layer 32. Approximately 0.5 $\mu$m of residual $p^{++}$ is removed by low temperature oxidation and oxide wet etch, or by HCl vapor etch. This leaves a 0.5 $\mu$m thick layer 32 of high resistivity. Oxide layer 34 was originally TEOS oxide deposited on layer 32, and the quality of oxide layer 34 and its interface with layer 32 are preserved through the processing. Polysilicon layer 36 prevents reaction of oxide 34 with glass 38 and provides a thermal match to silicon layer 32.

The coefficient of thermal expansion of glass 38 is greater than the coefficient of silicon 42, so epilayer 32 will be stretched during high temperature processing unless polysilicon buffer layer 36 is sufficiently thick to provide rigidity. The structural rigidity is determined by the composite thickness of silicon layer 32, oxide layer 34, and polysilicon buffer layer 36. For a 10 $\mu$m thick silicon layer 32 plus a 1 $\mu$m thick oxide layer 34, a 15 $\mu$m thick polysilicon buffer layer 36 has been found sufficiently thick for processing up to 1,100° C. If silicon layer 32 is thicker, then polysilicon buffer layer 36 can be correspondingly thinner. For low temperature processing (in the vicinity of 900° C.) polysilicon buffer layer 36 can be very thin because its mechanical rigidity is not needed and a thickness of 0.2 $\mu$m may be enough to prevent the reaction of oxide 34 with glass 38.

Figure 3:
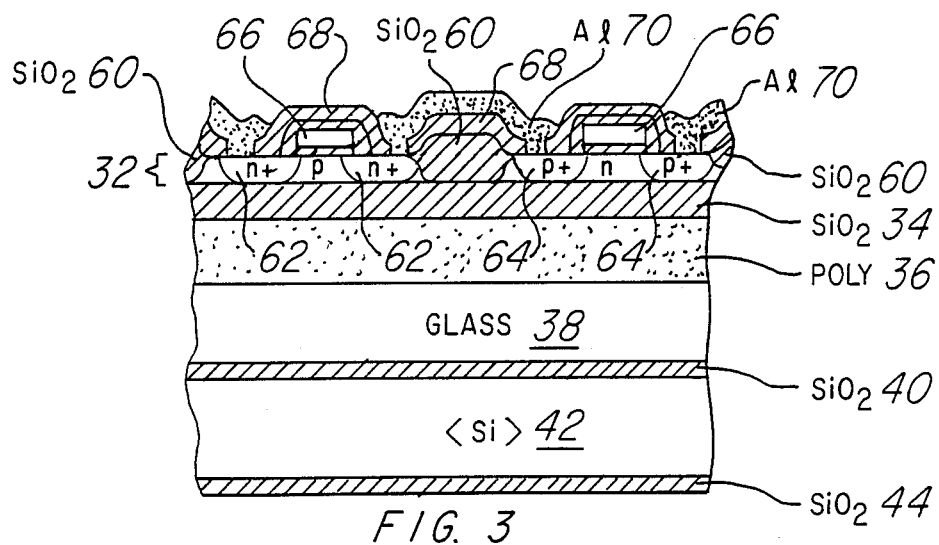
FIGS. 3–4 are cross sectional elevation views of a first preferred embodiment structure with MOSFET devices.

FIG. 3 illustrates in cross sectional elevation view the first preferred embodiment structure 30 of FIG. 1 with a schematic CMOS pair of devices. In particular, p$^-$ layer 32 has been implanted to form p and n wells with field oxide 60 grown down to silicon dioxide insulator layer 34 for isolation of devices. The n channel device has n+ source and drain 62 extending down to insulator layer 34 as does the p channel device have p+ source and drain 64. Polysilicon gates 66, dielectric 68, and aluminum interconnections 70 are also shown. The first preferred embodiment structure 30 is able to withstand standard CMOS processing despite its composition as layers of materials with differing temperature coefficients of expansion due in part to the rigidity supplied by the thick polysilicon layer 36.

Figure 4:
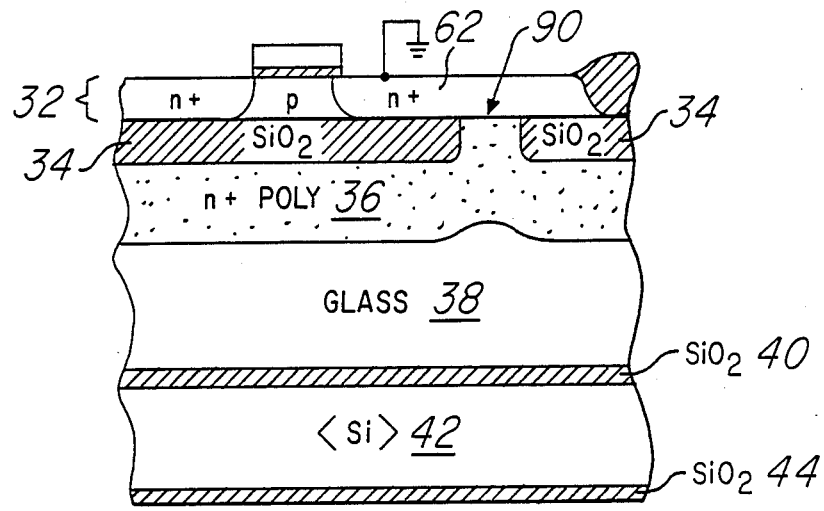

FIG. 4 illustrates in cross sectional elevation view a preferred embodiment variation of the structure of FIG. 3 in which an opening through insulating oxide 34 permits n+ polysilicon buffer layer 36 to contact 90 n+ doped region 62 in p$^-$ silicon-on-insulator layer 32. Contact 90 of polysilicon buffer layer 36 with region 62 assures a common potential for polysilicon 36 and region 62 which may be ground as illustrated. Contact 90 is formed by photolithographically patterning and etching oxide 34 prior to deposition of polysilicon 36 (step (d) of the first preferred embodiment method). Glass 38 will fill in any nonplanarity in polysilicon 36 caused by contact 90.

Second preferred embodiment silicon-on-insulator structure has the same general layered structure shown in FIG. 1 but with the following difference: silicon layer 32 is doped n$^-$ and is 3.0 $\mu$m thick with a 0.5 $\mu$m thick buried n+ layer at the interface of silicon layer 32 and oxide layer 34. The buried layer can be formed by diffusion, implant, or in situ doped epilayer growth prior to the oxide deposition. This thickness and doping are convenient for fabricating bipolar transistors. The first preferred embodiment method of fabrication need be only slightly modified to fabricate the second preferred embodiment structure: the growth of epitaxial silicon layer 32 is with in situ arsenic doping instead of boron and for a longer time to produce a thicker layer.

Figure 5:
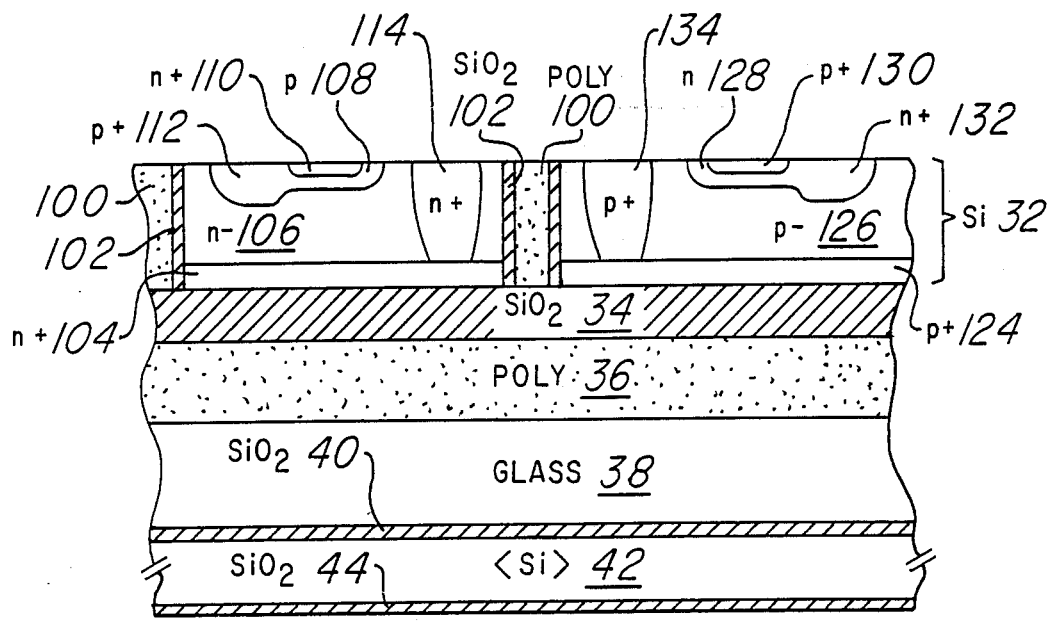
FIG. 5 is a cross sectional elevation view of a second preferred embodiment structure variant with bipolar devices.

FIG. 5 illustrates in cross sectional elevation view a variation of the second preferred embodiment structure with complementary bipolar transistors and trench isolation. In particular, silicon layer 32 is 15 $\mu$m thick with 3 $\mu$m wide trenches with silicon dioxide 102 sidewalls and filled with polysilicon 100 and extending down to oxide 34 for isolation. Complementary bipolar transistors have been formed in silicon layer 32. The n-p-n transistor has n+ buried layer 104, n$^-$ collector 106, p base 108, n+ emitter 110, p+ extrinsic base 112, and n+ deep collector contact 114; whereas, the p-n-p transistor has p+ buried layer 124, p$^-$ collector 126, n base 128, p+ emitter 130, n+ extrinsic base 132, and p+ deep collector contact 134. The buried layers 104 and 124 could be formed by implantation after the epitaxial growth of silicon layer 32 and before oxide 34 deposition, and the other doped regions could be formed by implantation after the polishing and etchback of the second substrate and the p++ etchstop layer; and the trench isolation may be formed by reactive ion etching trenches followed by deposition of oxide 102 and polysilicon 100 plus a planarization to remove the polysilicon and oxide outside of the trenches.

Other preferred embodiment methods of fabrication for either the first or second preferred embodiment or similar silicon-on-insulator structures are similar to the first preferred embodiment method with the following substitutional steps, either singly or in combinations:

(a) Dope p++ etchstop layer 52 (first preferred embodiment method step (a)) by ion implant germanium into high resistivity (100) oriented, four-inch diameter second silicon substrate 50 at 200 keV with a total dose of $1 \times 10^{16}$/cm$^2$ to amorphize the silicon layer, then ion implant boron (B$^{11}$) at 20 keV with a total dose of $1 \times 10^{16}$/cm$^2$ to dope layer 52. The preamorphization with germanium allows the boron implant to be annealed at about 900° C. to form p++ layer 52 to a thickness of 0.2 $\mu$m at the surface of substrate 50 without any residual defects.

(b) Epitaxially grow silicon layer 32 (first preferred embodiment step (b)) in two splits to limit autodoping effects. Layer 32 may be undoped or p$^-$ or n$^-$.

(c) Thermally grow oxide layer 34 in high pressure steam at 900° C. rather than by TEOS deposition as in first preferred embodiment step (c). The lowest practical temperature is used to limit diffusion of dopants from etchstop layer 52.

(d) Thermally oxidize the exposed silicon-on-insulator layer 32 (after the etching of etchstop layer 52 in preferred embodiment method step (h)) to an oxide thickness of 0.5 $\mu$m and then etch away this oxide; this oxidation and etch step is to remove any residual p or p++ not removed by the HF, HNO$_3$, and acetic acid etch. Of course, the original thickness of layer 32 will be made larger to compensate for the loss in this oxidation cleanup step.

(e) Etch with dilute HCl vapor the exposed silicon-on-insulator layer 32 (after the etching of etchstop layer 52 in preferred embodiment method step (h)) to improve the surface quality.

Tests were performed for devices fabricated in silicon-on-insulator glass bonded structures made by the alternative embodiment method of implanting boron with a low temperature anneal to form the etchstop layer. A lot to determine the effect of bond glass on device performance included p channel enclosed MOSFETs on wafers of following three categories.

(1) Bulk control wafers: Processed in routine clean-ups and furnaces.

(2) Glass bonded wafers with silicon-on-insulator layers 5, 9 and 15 $\mu$m thick: Processed in dedicated clean-ups and furnaces.

(3) Bulk wafers alongside glass bonded wafers: Bulk wafers processed in same clean-ups and furnaces as glass bonded wafers.

In all cases at least 25 devices were measured per wafer. The key results were:

(a) Leakage current: Leakage current was measured as a function of drain voltage with gate voltage at 1 V to assure that the device is off. The leakage current at VD = −5 V was measured to be less than 0.5 pA/um, which was comparable for wafers of each category.

(b) $V_T$ and Mobility: From the linear region characteristics, it was found that glass bonded wafers (category 2) had a larger $V_T$ (−2.2 V) than bulk wafers (−1.85 V) processed identically. The $V_T$ and mobility of wafers of categories 1) and 3) were comparable. The mobility of glass bonded wafers is about 75% that of bulk wafers. It is believed that the dislocations, introduced by the implanted boron etchstop which was not sufficiently annealed, are the source of low mobility and higher $V_T$.

(c) Subthreshold slope: The subthreshold slope for glass bonded devices was about 220 mV/dec as compared to about 120 mV/dec for bulk wafers of category (1) and (3). This once again can be explained by the dislocations.

On the basis of this characterization the following conclusions are drawn.

(i) The presence of glass bonded silicon-on-insulator has no adverse electrical effects.

(ii) Bulk wafers may be processed together with glass bonded wafers without fear of contamination from the bond glass.

(iii) Glass bonded material may be processed in routine manner without dedicated equipment.

MODIFICATIONS AND ADVANTAGES

Various modifications of the preferred embodiment devices and methods may be made while retaining the features of thick resist glass to bond the silicon-on-insulator to a holder substrate. For example, the dimensions of the substrates and thicknesses of the layers could be varied, such as 50 μm or more thick silicon 32 on oxide for high voltage applications; and the holder substrate (substrate 42 with oxides 40 and 44 of the first preferred embodiment) could be other materials, such as silicon without oxides, polysilicon, polysilicon with oxides, other glasses, and so forth. Further, the resist glass could have other organic components in place of the SC180:SC450 mixture, provided that the proper viscosity and adherence for thick wet layers to mollify particulate contamination is available; and the resist glass inorganic composition may also be varied provided that a low firing temperature is available to limit diffusion of the etchstop layer dopants, and that the glass does not emit contaminants (such as sodium) during silicon processing.

Similarly, the etchstop layer could be formed by diffusion, molecular beam epitaxy, MOCVD or a combination of doping and growth techniques. The orientation of the silicon-on-insulator may be adjusted by selecting the corresponding orientation for the substrate etched away (substrate 50 of the first preferred embodiment). The insulator could be silicon nitride or other dieletrics such as oxide/nitride stacks or titanium dioxide, although requirements on the quality of the interface with the silicon may limit the dielectrics available. The buffer layer can be of various materials and thicknesses, depending upon the glass composition and the insulator: for the first preferred embodiment the buffer both (1) prevented the glass reaction with the insulator and (2) provided rigidity to prevent stretching of the silicon-on-insulator layer due to the differing coefficients of thermal expansion of the glass and silicon. Thus if the glass has minimal reaction with the insulator and the coefficients of thermal expansion are approximately equal, then the buffer is less important.

The invention provides the advantage of high quality silicon-on-insulator structures with simple fabrication steps and ability to be used in routine silicon processing and without contamination from the bond glass.

What is claimed is:

1. An integrated circuit, comprising:
   (a) a silicon layer with active devices;
   (b) said silicon layer on an insulating layer;
   (c) said insulating layer on a buffer layer; and
   (d) a glass layer bonding said buffer layer to a substrate, said glass layer of composition characterized by heating of a mixture of glass paticles in a liquid between said buffer layer and said substrate to partially drive off and partially decompose said liquid plus fire said glass particles.

2. The integrated circuit of claim 1, wherein:
   (a) said insulating layer is silicon dioxide;
   (b) said buffer layer is polysilicon;
   (c) said substrate is silicon; and
   (d) said glass layer includes PbO and $SiO_2$.

3. The integrated circuit of claim 2, wherein:
   (a) said silicon layer is less than 1.0 μm thick.

4. The integrated circuit of claim 2, wherein:
   (a) said silicon layer is less than 60 μm thick and includes a heavily doped buried layer adjacent said insulating layer.

5. The integrated circuit of claim 1, wherein:
   (a) said buffer layer is rigid to stress isolate said silicon layer from said glass layer and substrate.

6. The integrated circuit of claim 1, wherein:
   (a) said buffer layer is a barrier to reaction of said insulating layer with said glass.

7. The integrated circuit of claim 1, wherein:
   (a) said glass layer is more than 10 μm thick.

8. The integrated circuit of claim 1, wherein:
   (a) said glass layer is characterized by essentially no contaminant emissions at processing temperatures of 1,000° C.

9. The integrated circuit of claim 1, wherein:
   (a) said silicon contacts said buffer layer through at least one via in said insulating layer; and
   (b) said buffer layer is n+ doped polysilicon.

10. A silicon-on-insulator structure, comprising:
    (a) a silicon substrate with a silicon dioxide layer on a first surface;
    (b) a glass bonding layer on said silicon dioxide layer;
    (c) a buffer layer on said glass bonding layer, said glass bonding layer of composition characterized by heating of a mixture of glass paticles in a liquid between said buffer layer and said silicon dioxide layer to partially drive off and partially decompose said liquid plus fire said glass particles;
    (d) an insulation layer on said buffer layer; and
    (e) a layer of single crystal silicon on said insulation layer.

11. The structure of claim 10, wherein:
    (a) said glass bonding layer includes PbO, $SiO_2$, and $Al_2O_3$;
    (b) said buffer layer is polysilicon; and
    (c) said insulation layer is silicon dioxide.

12. An integrated circuit, comprising:
(a) a silicon layer with active devices;
(b) said silicon layer on an insulating layer;
(c) said insulating layer on a buffer layer; and
(d) a glass layer bonding said buffer layer to a substrate, said glass layer of thickness greater than about 10 microns.

13. The integrated circuit of claim 12, wherein:
(a) said insulating layer is silicon dioxide;
(b) said buffer layer is polysilicon;
(c) said substrate is silicon; and
(d) said glass layer includes PbO and $SiO_2$.

* * * * *